(12) United States Patent
Jang et al.

(10) Patent No.: US 8,743,639 B2
(45) Date of Patent: Jun. 3, 2014

(54) SEMICONDUCTOR MEMORY DEVICE

(75) Inventors: Woong Ju Jang, Yongin-si (KR); Kyu Nam Lim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 116 days.

(21) Appl. No.: 13/494,798

(22) Filed: Jun. 12, 2012

(65) Prior Publication Data

US 2013/0176802 A1     Jul. 11, 2013

(30) Foreign Application Priority Data

Jan. 10, 2012    (KR) .................. 10-2012-0003168

(51) Int. Cl.
    *G11C 7/00*       (2006.01)
    *G11C 7/02*       (2006.01)
    *G11C 5/14*       (2006.01)

(52) U.S. Cl.
    USPC ........... 365/203; 365/205; 365/207; 365/208; 365/226

(58) Field of Classification Search
    USPC .......................... 365/203, 205, 207, 208, 226
    See application file for complete search history.

(56) References Cited

U.S. PATENT DOCUMENTS

| | | | |
|---|---|---|---|
| 7,800,970 B2 * | 9/2010 | Hong et al. | 365/207 |
| 7,929,367 B2 * | 4/2011 | Yoo et al. | 365/205 |
| 8,416,632 B2 * | 4/2013 | Kim et al. | 365/203 |
| 8,432,762 B2 * | 4/2013 | Kim et al. | 365/207 |

OTHER PUBLICATIONS

Satoru Akiyama et al., Low-V, Small-Offset Gated Presamplifier for Sub-1V Gigabit DRAM Arrays, 2009, 3 pages, Hitachi, KokUbunji, Japan.

* cited by examiner

*Primary Examiner* — Trong Phan
(74) *Attorney, Agent, or Firm* — William Park & Associates Patent Ltd.

(57) ABSTRACT

A semiconductor memory device includes a switching unit coupled between a local sense amplifier and a bit line sense amplifier and configured to be turned on in response to a switching signal which is enabled in synchronization with an enable signal for enabling the local sense amplifier and disabled at a time point where a preset period passes after a first power for enabling the bit line sense amplifier is precharged.

20 Claims, 4 Drawing Sheets

SEMICONDUCTOR MEMORY DEVICE

CROSS-REFERENCES TO RELATED APPLICATIONS

The present application claims priority under 35 U.S.C 119(a) to Korean Application No. 10-2012-0003168, filed on Jan. 10, 2012, in the Korean intellectual property Office, which is incorporated herein by reference in its entirety.

BACKGROUND

Recently, research has been actively conducted on a variety of technologies for reducing current consumption of a semiconductor memory device mounted in a portable system such as a mobile phone or notebook computer. In particular, technology for reducing a current consumed in a precharge mode as well as in an active mode is being researched.

FIG. 1 is a block diagram illustrating the configuration of a known semiconductor memory device.

Referring to FIG. 1, the known semiconductor memory device includes a memory cell 11, a local sense amplifier 12, a bit line sense amplifier 13, and an input/output switching unit 14.

The memory cell 11 includes a cell transistor N11 and a cell capacitor C11. The memory cell 11 configured in such a manner stores data DATA in the cell capacitor C11 through the cell transistor N11.

The local sense amplifier 12 includes a plurality of NMOS transistors N12 to N15. The NMOS transistor N12 is coupled between a bit line bar BLB and a first node nd14 and configured to be turned on when an enable signal SG is enabled to a logic high level. The NMOS transistor N13 is coupled between a bit line BL and a second node nd15 and configured to be turned on when the enable signal SG is enabled to a logic high level. The NMOS transistor N14 is coupled between the first node nd14 and a third node nd16 and configured to be turned on when a signal of the bit line BL is at a logic high level. The NMOS transistor N15 is coupled between the second node nd15 and the third node nd16 and configured to be turned on when a signal of the bit line bar BLB is at a logic high level. The threshold voltages Vt of the NMOS transistor N14 and the NMOS transistor N15 are lower by about 100 mV than the threshold voltages of the NMOS transistor N12 and the NMOS transistor N13. The local sense amplifier 12 is enabled in a period where the enable signal SG is enabled and performs an operation of sensing and amplifying a potential difference ΔV between the bit line BL and the bit line bar BLB (hereafter, referred to as a sensing operation). The enable signal SG is enabled to a logic high level in synchronization with an active command, and disabled before the bit line sense amplifier 13 performs a sensing operation.

The bit line sense amplifier 13 is configured to perform a sensing operation when a first power SB is driven to a ground voltage and a second power RTO is driven to an external voltage VDD.

The input/output switching unit 14 includes NMOS transistors N16 and N17, and is configured to transmit data DATA loaded in the bit line BL to an input/output line SIO and transmit data DATAB loaded in the bit line bar BLB to an input/output line bar SIOB, when an output enable signal YI is enabled to a logic high level.

Hereafter, the operation of the known semiconductor memory device will be described. The following descriptions will be divided into a case in which the known semiconductor memory device operates in an active mode and a case in which the known semiconductor memory device operates in a precharge mode.

First, when a word line WL is selected by an active command, charge sharing occurs between the cell capacitor C11 and the bit line BL. A potential difference ΔV occurs between the bit line BL and the bit line bar BLB due to the charge sharing between the bit line BL and the cell capacitor C11. The local sense amplifier 12 performs a sensing operation in a period where the enable signal SG is enabled. The bit line sense amplifier 13 performs a sensing operation when the first power SB is driven to the ground voltage VSS and the second power RTO is driven to the external voltage VDD. Here, the enable signal SG is enabled in synchronization with the active command, and disabled before the bit line sense amplifier 13 performs a sensing operation. When the output enable signal YI is enabled to a logic high level, the NMOS transistors N16 and N17 of the input/output switching unit 14 are turned on to transmit the data DATA loaded in the bit line BL to the input/output line SIO and transmit the data DATAB loaded in the bit line bar BLB to the input/output line bar SIOB.

Then, the first power SB and the second power RTO are driven to a precharge voltage VBLP having a ½ level of the core voltage VCORE by a precharge command. The first power SB and the second power RTO drive the bit line BL and the bit line bar BLB to the precharge voltage VBLP. In the local sense amplifier 12, a microcurrent flows to the ground voltage VSS through the NMOS transistors N14 and N15 having a low threshold voltage Vt. Therefore, since electric charges of the first and second nodes nd14 and nd15 are reduced, a voltage difference between drain and source terminals of the NMOS transistors N12 and N13 increases. Accordingly, a microcurrent is also passed through the NMOS transistors N12 and N13. As a result, in the precharge mode, a leakage current path is formed between the bit line bar BLB and the ground voltage VSS through the NMOS transistors N12 and N14, and a leakage current path is also formed between the bit line BL and the ground voltage VSS through the NMOS transistors N13 and N15. Therefore, the current consumption of the semiconductor memory device increases.

SUMMARY

An embodiment of the present invention relates to a semiconductor memory device capable of blocking a leakage current path by supplying a precharge voltage to a local sense amplifier in a precharge mode, thereby substantially reducing unnecessary current consumption.

In an embodiment of the present invention, a semiconductor memory device includes a switching unit coupled between a local sense amplifier and a bit line sense amplifier and configured to be turned on in response to a switching signal which is enabled in synchronization with an enable signal for enabling the local sense amplifier and disabled at a time point where a preset period passes after a first power for enabling the bit line sense amplifier is precharged.

In an embodiment of the present invention, a semiconductor memory device includes: a local sense amplifier configured to perform a sensing operation in a period where an enable signal is enabled and a first power is driven to a first level; a bit line sense amplifier configured to perform a sensing operation in a period where the first power is driven to the first level and a second power is driven to a second level; and a switching unit configured to supply the first power to the local sense amplifier in response to a switching signal.

In an embodiment of the present invention, a semiconductor memory device includes: a semiconductor memory device comprising: a switching unit coupled between a local sense amplifier and a bit line sense amplifier and configured to be turned on in response to a switching signal which is enabled in synchronization with an enable signal for enabling the local sense amplifier and disabled at a time point where a preset period passes after a first power for enabling the bit line sense amplifier is precharged; a switching signal generation unit configured to receive the enable signal and the first power and generate the switching signal; and a power generation unit configured to generate the first power in response to control signals.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
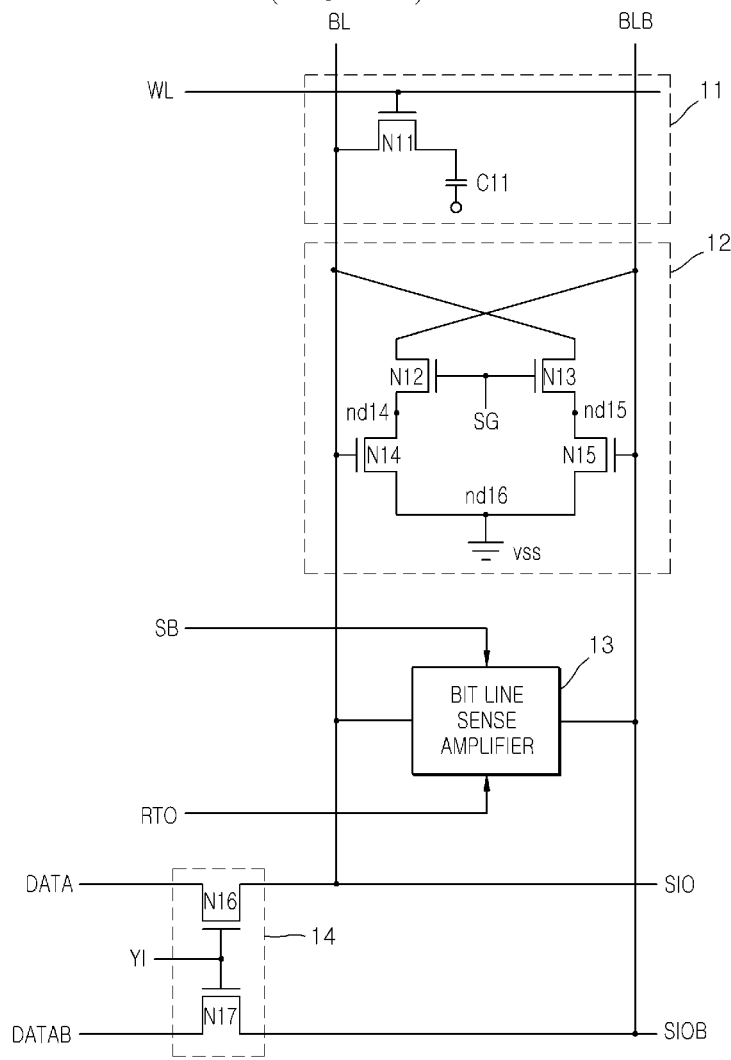
FIG. 1 is a block diagram illustrating the configuration of a known semiconductor memory device.
Figure 2:
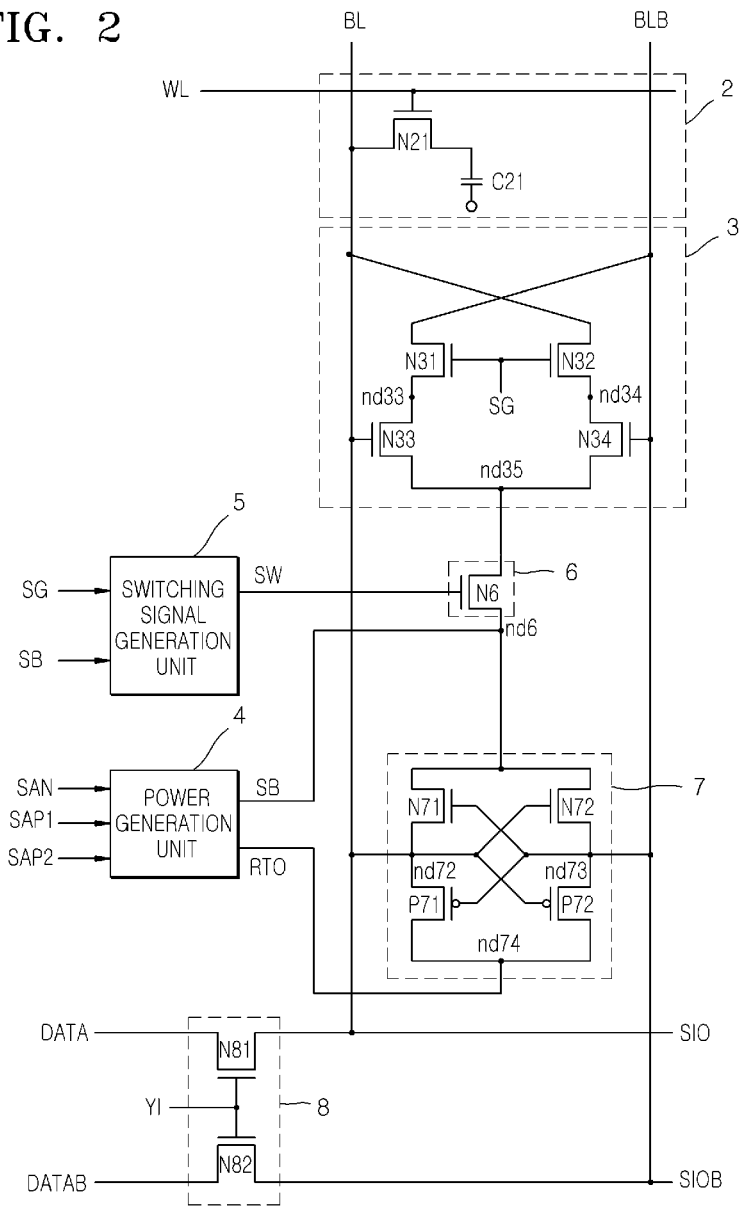
FIG. 2 is a block diagram illustrating the configuration of a semiconductor memory device in accordance with an embodiment of the present invention.

FIG. 2 is a block diagram illustrating the configuration of a semiconductor memory device in accordance with an embodiment of the present invention.

Referring to FIG. 2, the semiconductor memory device in accordance with an embodiment of the present invention includes a memory cell 2, a local sense amplifier 3, a power generation unit 4, a switching signal generation unit 5, a switching unit 6, a bit line sense amplifier 7, and an input/output switching unit 8. The memory cell 2 includes a cell transistor N21 and a cell capacitor C21. The memory cell 2 configured in such a manner transmits data DATA through the cell transistor N21 and stores the data DATA in the cell capacitor C21.

The local sense amplifier 3 includes a plurality of NMOS transistors N31 to N34. The NMOS transistor N31 is coupled between a bit line bar BLB and a first node nd33 and configured to be turned on when an enable signal SG is enabled to a logic high level. The NMOS transistor N32 is coupled between a bit line BL and a second node nd34 and configured to be turned on when the enable signal SG is enabled to a logic high level. The NMOS transistor N33 is coupled between the first node nd33 and a third node nd35 and configured to be turned on when a signal of the bit line BL is at a logic high level. The NMOS transistor N34 is coupled between the second node nd34 and the third node nd35 and configured to be turned on when a signal of the bit line bar BLB is at a logic high level. According to an example, the threshold voltages Vt of the NMOS transistor N33 and the NMOS transistor N34 are lower by about 100 mV than the threshold voltages Vt of the NMOS transistor N31 and the NMOS transistor N32.

According to an example, the enable signal SG is enabled to a logic high level in synchronization with an active command, and disabled before the bit line sense amplifier 7 performs a sensing operation.

Figure 3:
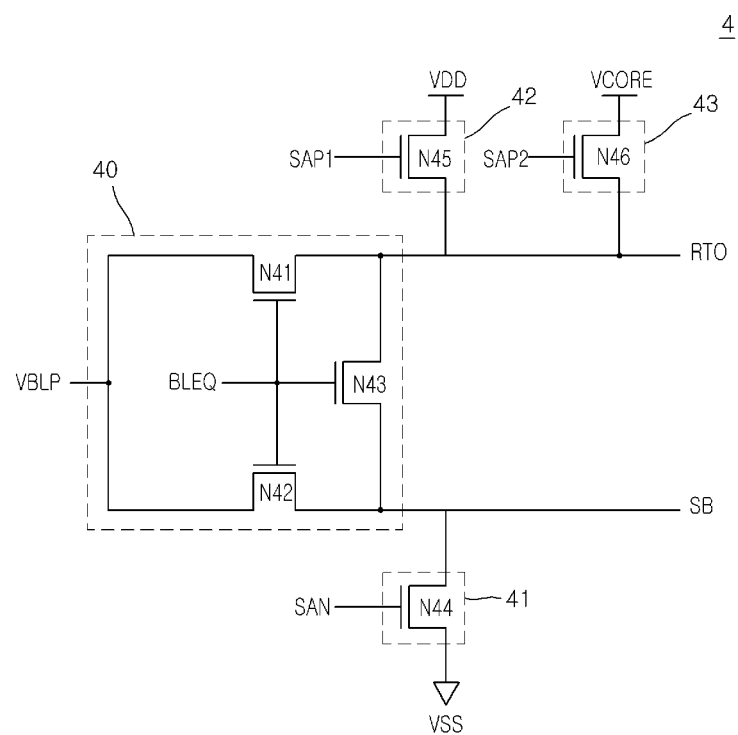
FIG. 3 is a circuit diagram illustrating a power generation unit included in the semiconductor memory device illustrated in FIG. 2.

Referring to FIG. 3, the power generation unit 4 includes a precharge section 40, a first power generation section 41, a second power generation section 42, and a third power generation section 43. The precharge section 40 includes a plurality of NMOS transistors N41 to N43, and is configured to precharge a first power SB and a second power RTO to a precharge voltage VBLP having, for example, a ½ level of a core voltage VCORE, when an equalization signal BLEQ is enabled to a logic high level by a precharge command. The first voltage generation section 41 includes an NMOS transistor N44, and is configured to drive the first power SB to the ground voltage VSS when a first control signal SAN is enabled to a logic high level by an active command. The second power generation section 42 includes an NMOS transistor N45, and is configured to drive the second power RTO to an external voltage VDD, when a second control signal SAP1 is enabled to a logic high level by an active command. The third power generation section 43 includes an NMOS transistor N46, and is configured to drive the second power RTO to the core voltage VCORE, after a preset period passes when a third control signal SAP2 is enabled to a logic high level by an active command. Depending on embodiments, the first power SB and the second power RTO may be simultaneously driven, the first power SB may be first driven, or the second power RTO may be first driven. In an embodiment, the case in which the first power SB is driven before the second power RTO will be described.

Referring to FIG. 2 again, the switching signal generation unit 5 is configured to generate a switching signal SW which is enabled in synchronization with the enable signal SG and disabled at a time point where a preset period passes after the first power SB is precharged to the precharge voltage VBLP. Here, the preset period refers to a period enough to drive the third node nd35 to the precharge voltage VBLP.

The switching unit 6 is coupled between the local sense amplifier 3 and the bit line sense amplifier 7. That is, the switching unit 6 is coupled between the third node nd35 and a fourth node nd6. Also, the switching unit 6 includes an NMOS transistor N6, and is configured to be turned on when the switching signal SW is enabled to a logic high level.

The bit line sense amplifier 7 includes NMOS transistors N71 and N72 and PMOS transistors P71 and P72. The NMOS transistor N71 is coupled between the fourth node nd6 and a fifth node nd72 and configured to be turned on when the signal of the bit line bar BLB is at a logic high level. The NMOS transistor N72 is coupled between the fourth node nd6 and a sixth node nd73 and configured to be turned on when the signal of the bit line BL is at a logic high level. The PMOS transistor P71 is coupled between the fifth node nd72 and a seventh node nd74 and configured to be turned on when the signal of the bit line bar BL is at a logic low level. The PMOS transistor P72 is coupled between the sixth node nd73 and the seventh node nd74 and configured to be turned on when the signal of the bit line BL is at a logic low level. The bit line sense amplifier 7 configured in such a manner performs a sensing operation when the first power SB supplied to the fourth node nd6 is driven to the ground voltage VSS and the second power RTO supplied to the seventh node nd74 is driven to the external voltage VDD.

The input/output switching unit 8 includes NMOS transistors N81 and N82, and is configured to transmit data DATA loaded in the bit line BL to an input/output line SIO and transmit data DATAB loaded in the bit line bar BLB to an input/output line bar SIOB, when an output enable signal YI is enabled to a logic high level.

Figure 4:
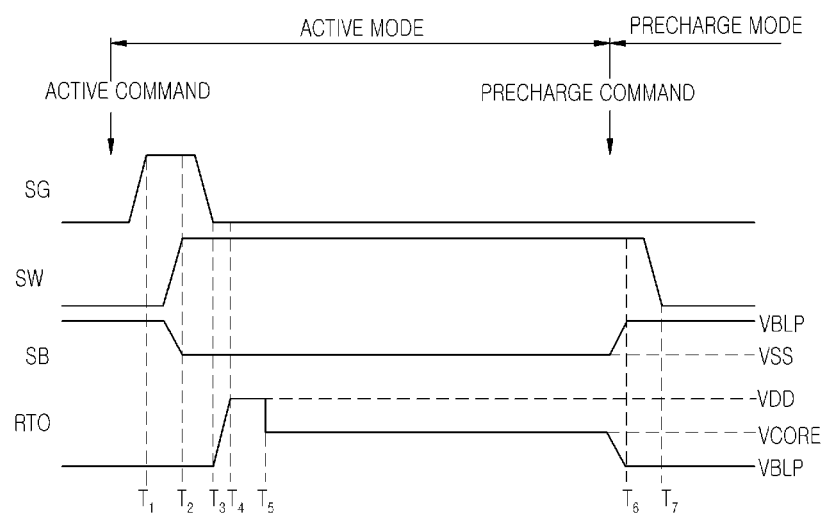
FIG. 4 is a timing diagram explaining the operation of the semiconductor memory device illustrated in FIG. 2.

The operation of the semiconductor memory device configured in the above-described manner will be described in detail with reference to FIG. 4. The following descriptions will be divided into a case where the semiconductor memory device operates in an active mode and a case where the semiconductor memory device operates in a precharge mode.

First, the case where the semiconductor memory device operates in the active mode will be described as follows.

When a word line WL is selected by an active command, charge sharing occurs between the cell capacitor C21 and the bit line BL, and a potential difference ΔV occurs between the bit line BL and the bit line bar BLB. At a time point T1, the enable signal SG is enabled to a logic high level in synchronization with the active command. At a time point T2, the switching signal SW is enabled to a logic high level in synchronization with the enable signal SG. When the first power SB is driven to the ground voltage VSS by the active command, the local sense amplifier 3 is enabled to perform a sensing operation.

At a time point T3 before the bit line sense amplifier 7 is enabled to perform a sensing operation, the enable signal SG is disabled to stop the operation of the local sense amplifier 3. When the second power RTO is driven to the external voltage VDD at a time point T4 or driven to the core voltage VCORE at a time point T5 after a preset period passes, the bit line sense amplifier 7 performs a sensing operation.

Next, the case where the semiconductor memory device operates in the precharge mode will be described.

At a time point T6, the first power SB and the second power RTO are precharged to the precharge voltage VBLP having, for example, a ½ level of the core voltage VCORE by a precharge command. The switching signal SW is disabled to a logic high level at a time point T7 where a preset period passes after the first power SB is precharged to the precharge voltage VBLP. In the precharge mode, the third node nd35 is driven to the precharge voltage VBLP, as illustrated in FIG. 2. Since the third node nd35 is driven to the precharge voltage VBLP instead of the ground voltage VSS, the amount of current leaking through the NMOS transistors N33 and N34 is reduced. Therefore, since the electric charges of the first and second node nd33 and nd34 are not reduced, a leakage current path through the NMOS transistors N31 and N33 or the NMOS transistors N32 and N34 is not formed.

The semiconductor memory device in accordance with an embodiment of the present invention may reduce unnecessary current consumption by minimizing or blocking a leakage current path formed in the local sense amplifier in the precharge mode.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor memory device comprising a switching unit coupled between a local sense amplifier and a bit line sense amplifier and configured to be turned on in response to a switching signal which is enabled in synchronization with an enable signal for enabling the local sense amplifier and disabled at a time point where a preset period passes after a first power for enabling the bit line sense amplifier is precharged.

2. The semiconductor memory device of claim 1, wherein the bit line sense amplifier performs a sensing operation in a period where the first power is driven to a first level and a second power is driven to a second level, wherein the first power and the second power are driven to the first level and the second level, respectively, by an active command.

3. The semiconductor memory device of claim 2, wherein the local sense amplifier performs a sensing operation in a period where the enable signal is enabled and the first power is driven to the first level, wherein the enable signal is enabled in synchronization with the active command and disabled before the bit line sense amplifier performs a sensing operation.

4. The semiconductor memory device of claim 2, wherein the second power is driven to a third level after a preset period passes.

5. The semiconductor memory device of claim 1, wherein the local sense amplifier comprises:
a first element coupled between a bit line bar and a first node and configured to be turned on in response to the enable signal;
a second element coupled between a bit line and a second node and configured to be turned on in response to the enable signal;
a third element coupled between the first node and a third node and configured to be turned on in response to a signal of the bit line; and
a fourth element coupled between the second node and the third node and configured to be turned on in response to a signal of the bit line bar,
wherein the switching unit is coupled to the third node.

6. The semiconductor memory device of claim 5, wherein the third and fourth elements have a lower threshold voltage than the first and second elements.

7. A semiconductor memory device comprising:
a local sense amplifier configured to perform a sensing operation in a period where an enable signal is enabled and a first power is driven to a first level;
a bit line sense amplifier configured to perform a sensing operation in a period where the first power is driven to the first level and a second power is driven to a second level; and
a switching unit configured to supply the first power to the local sense amplifier in response to a switching signal.

8. The semiconductor memory device of claim 7, wherein the enable signal is enabled in synchronization with an active command and disabled before the bit line sense amplifier performs a sensing operation.

9. The semiconductor memory device of claim 8, wherein the switching signal is enabled in synchronization with the enable signal and disabled at a time point where a preset period passes after the first power is precharged.

10. The semiconductor memory device of claim 8, wherein the first power and the second power are driven to the first level and the second level, respectively, by the active command.

11. The semiconductor memory device of claim 10, wherein the second power is driven to a third level after a preset period passes.

12. The semiconductor memory device of claim 7, wherein the local sense amplifier comprises:
a first element coupled between a bit line bar and a first node and configured to be turned on in response to the enable signal;
a second element coupled between a bit line and a second node and configured to be turned on in response to the enable signal;

a third element coupled between the first node and a third node and configured to be turned on in response to a signal of the bit line; and a fourth element coupled between the second node and the third node and configured to be turned on in response to a signal of the bit line bar, wherein the switching unit is coupled to the third node.

13. The semiconductor memory device of claim 12, wherein the third and fourth elements have a lower threshold voltage than the first and second elements.

14. The semiconductor memory device of claim 7, further comprising:

a switching signal generation unit configured to receive the enable signal and the first power and generate the switching signal; and a power generation unit configured to generate the first and second powers in response to first to third control signals.

15. The semiconductor memory device of claim 14, wherein the power generation unit comprises:

a precharge section configured to precharge the first and second powers in response to an equalization signal;

a first power generation section configured to drive the first power to the first level in response to the first control signal;

a second power generation section configured to drive the second power to the second level in response to the second control signal; and a third power generation section configured to drive the second power to a third level in response to the third control signal.

16. A semiconductor memory device comprising:

a switching unit coupled between a local sense amplifier and a bit line sense amplifier and configured to be turned on in response to a switching signal which is enabled in synchronization with an enable signal for enabling the local sense amplifier and disabled at a time point where a preset period passes after a first power for enabling the bit line sense amplifier is precharged;

a switching signal generation unit configured to receive the enable signal and the first power and generate the switching signal; and a power generation unit configured to generate the first power in response to control signals.

17. The semiconductor memory device of claim 16, wherein the power generation unit comprises:

a precharge section configured to precharge the first power in response to an equalization signal; and a first power generation section configured to drive the first power to a first level in response to one or more of the control signals.

18. The semiconductor memory device of claim 17, wherein the power generation unit further comprises:

a second power generation section configured to drive a second power to a second level in response to one or more of the control signals; and a third power generation section configured to drive the second power to a third level in response to one or more of the control signals, wherein the bit line sense amplifier performs a sensing operation in a period where the first power is driven to a first level and a second power is driven to a second level in response to an active command.

19. The semiconductor memory device of claim 18, wherein the local sense amplifier performs a sensing operation in a period where the enable signal is enabled and the first power is driven to the first level, wherein the enable signal is enabled in synchronization with the active command and disabled before the bit line sense amplifier performs a sensing operation.

20. The semiconductor memory device of claim 18, wherein the second power is driven to the third level after a preset period passes.

* * * * *